(12) United States Patent
Lin et al.

(10) Patent No.: US 10,784,221 B2
(45) Date of Patent: Sep. 22, 2020

(54) METHOD OF PROCESSING SOLDER BUMP BY VACUUM ANNEALING

(75) Inventors: Hsiu-Jen Lin, Zhubei (TW); Chung-Shi Liu, Hsinchu (TW); Ming-Da Cheng, Jhubei (TW); Chung-Cheng Lin, New Taipei (TW); Yu-Peng Tsai, Taipei (TW); Cheng-Ting Chen, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1025 days.

(21) Appl. No.: 13/312,395

(22) Filed: Dec. 6, 2011

(65) Prior Publication Data

US 2013/0143364 A1 Jun. 6, 2013

(51) Int. Cl.
| | |
|---|---|
| *H01L 21/58* | (2006.01) |
| *H01L 23/00* | (2006.01) |
| *H05K 3/34* | (2006.01) |
| *H05K 3/28* | (2006.01) |
| *H01L 21/48* | (2006.01) |

(52) U.S. Cl.
CPC .............. *H01L 24/11* (2013.01); *H01L 24/81* (2013.01); *H05K 3/3457* (2013.01); *H01L 21/4853* (2013.01); *H01L 24/05* (2013.01); *H01L 24/13* (2013.01); *H01L 24/16* (2013.01); *H01L 2224/0401* (2013.01); *H01L 2224/0557* (2013.01); *H01L 2224/05548* (2013.01); *H01L 2224/11334* (2013.01); *H01L 2224/11849* (2013.01); *H01L 2224/11901* (2013.01); *H01L 2224/131* (2013.01); *H01L 2224/13025* (2013.01); *H01L 2224/13109* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16225* (2013.01); *H01L 2224/812* (2013.01); *H01L 2224/8109* (2013.01); *H01L 2224/8121* (2013.01); *H01L 2224/8123* (2013.01); *H01L 2224/8191* (2013.01); *H01L 2224/81192* (2013.01); *H01L 2224/81193* (2013.01); *H01L 2224/81815* (2013.01); *H01L 2924/00014* (2013.01); *H01L 2924/01322* (2013.01); *H01L 2924/01327* (2013.01); *H05K 3/282* (2013.01); *H05K 3/3436* (2013.01); *H05K 2203/043* (2013.01); *H05K 2203/085* (2013.01); *H05K 2203/1194* (2013.01)

(58) Field of Classification Search
CPC ......... H01L 21/4853; H01L 2224/0401; H01L 2224/05548
USPC .................. 438/121, 106, 308, 522, 698
See application file for complete search history.

(56) References Cited

U.S. PATENT DOCUMENTS

| | | | | |
|---|---|---|---|---|
| 5,877,079 A | * | 3/1999 | Karasawa et al. | 438/613 |
| 5,998,043 A | * | 12/1999 | Sasaki | C04B 37/026 |
| | | | | 257/703 |
| 2002/0076910 A1 | * | 6/2002 | Pace | 438/613 |

(Continued)

*Primary Examiner* — Dale E Page
*Assistant Examiner* — Wilner Jean Baptiste
(74) *Attorney, Agent, or Firm* — Hauptman Ham, LLP

(57) ABSTRACT

A method includes vacuum annealing on a substrate having at least one solder bump to reduce voids at an interface of the at least one solder bump. A die is mounted over the substrate.

20 Claims, 4 Drawing Sheets

(56) References Cited

U.S. PATENT DOCUMENTS

| | | | | |
|---|---|---|---|---|
| 2002/0168797 A1* | 11/2002 | DiStefano et al. | | 438/106 |
| 2002/0174828 A1* | 11/2002 | Vasat et al. | | 117/90 |
| 2004/0007384 A1* | 1/2004 | Soga | H05K 3/3484 | |
| | | | | 174/260 |
| 2004/0238602 A1* | 12/2004 | Furuno et al. | | 228/180.22 |
| 2005/0285253 A1* | 12/2005 | Takashi | H01L 21/486 | |
| | | | | 257/698 |
| 2006/0260122 A1* | 11/2006 | Honjo et al. | | 29/829 |
| 2007/0207606 A1* | 9/2007 | Wang | B23K 1/203 | |
| | | | | 438/613 |
| 2008/0073414 A1* | 3/2008 | Saito et al. | | 228/244 |
| 2008/0254610 A1* | 10/2008 | Suga | H01L 21/4846 | |
| | | | | 438/612 |
| 2009/0023245 A1* | 1/2009 | Kitae | H05K 3/3436 | |
| | | | | 438/108 |
| 2009/0032971 A1* | 2/2009 | Chan | H01L 24/11 | |
| | | | | 257/777 |
| 2009/0045513 A1* | 2/2009 | Kim et al. | | 257/738 |
| 2010/0178735 A1* | 7/2010 | Pendse | H01L 24/03 | |
| | | | | 438/124 |
| 2010/0252926 A1* | 10/2010 | Kato | H01L 24/11 | |
| | | | | 257/738 |
| 2010/0276799 A1* | 11/2010 | Heng et al. | | 257/704 |
| 2011/0084386 A1* | 4/2011 | Pendse | H01L 23/3178 | |
| | | | | 257/737 |
| 2012/0115262 A1* | 5/2012 | Menard | H01L 21/6835 | |
| | | | | 438/26 |

\* cited by examiner

US 10,784,221 B2

1

METHOD OF PROCESSING SOLDER BUMP BY VACUUM ANNEALING

TECHNICAL FIELD

The present disclosure relates generally to integrated circuit (IC) manufacturing and, more particularly, a solder bump process.

BACKGROUND

Electromigration (EM) is the transport of material caused by the gradual movement of the ions in a conductor due to the momentum transfer between conducting electrons and diffusing metal atoms. A pre-existing void inside a solder bump in integrated circuits can accelerate the EM process for the solder bump at the interface of bump/under bump metal (UBM) and/or bump/substrate due to the Joule heating and current crowding effect. The accelerated EM process can reduce the bump EM lifetime (i.e, the time before failure from EM).

BRIEF DESCRIPTION OF THE DRAWINGS

Reference is now made to the following descriptions taken in conjunction with the accompanying drawings, in which.

DETAILED DESCRIPTION

Figure 1:
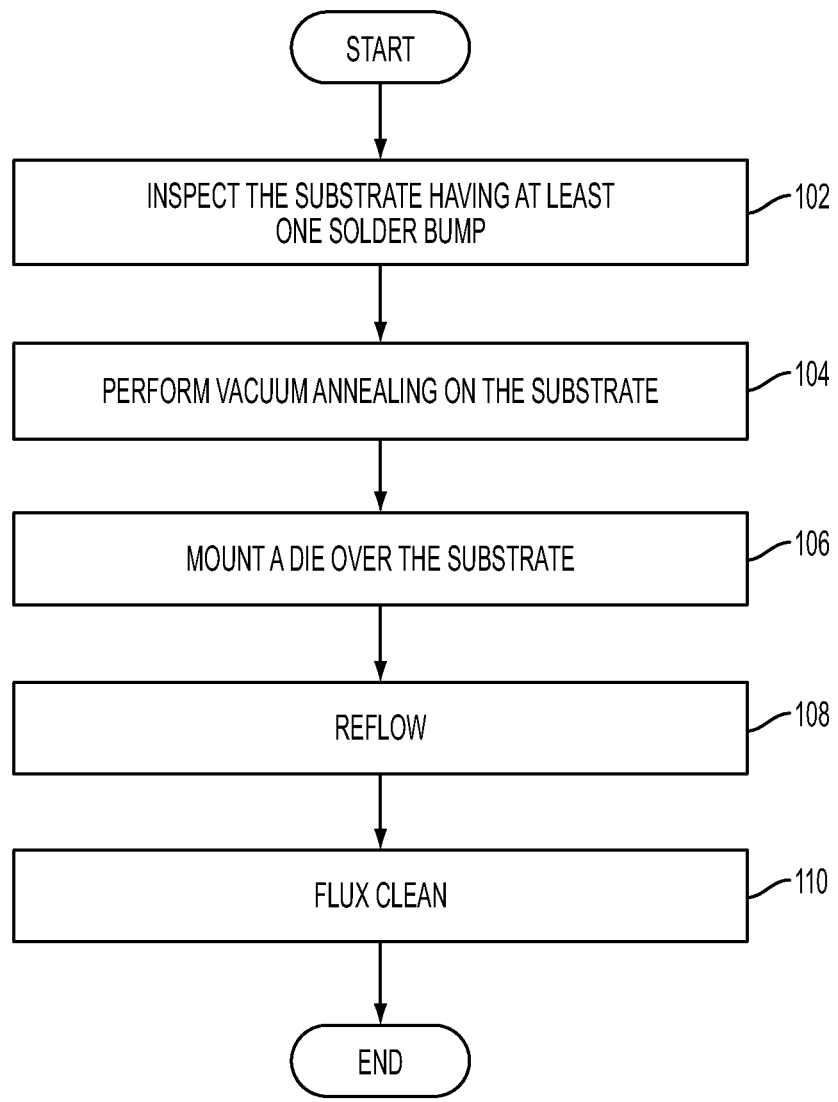
FIG. 1 is a flowchart of an exemplary method to improve the EM lifetime of solder bumps according to some embodiments.

The making and using of various embodiments are discussed in detail below. It should be appreciated, however, that the present disclosure provides many applicable inventive concepts that can be embodied in a wide variety of specific contexts. The specific embodiments discussed are illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features

2 relationship to another feature. The spatially relative terms are intended to cover different orientations of the device including the features.

FIG. 1 is a flowchart of an exemplary method to improve the EM lifetime of solder bumps according to some embodiments. The method in FIG. 1 is described below with reference to FIGS. 2, 3A, and 3B. At step 102, a substrate having at least one solder bump is inspected for defects (e.g., structural defects), foreign particles, and residues (e.g., copper trace residue) from previous processes, e.g., using a microscope. The substrate can be an integrated circuit substrate or a printed circuit board (PCB). If the substrate passes the inspection, the substrate is ready for further processing. If the substrate does not pass the inspection, the substrate may be discarded or needs additional processing to correct the defects or clean the residues.

Figure 2:
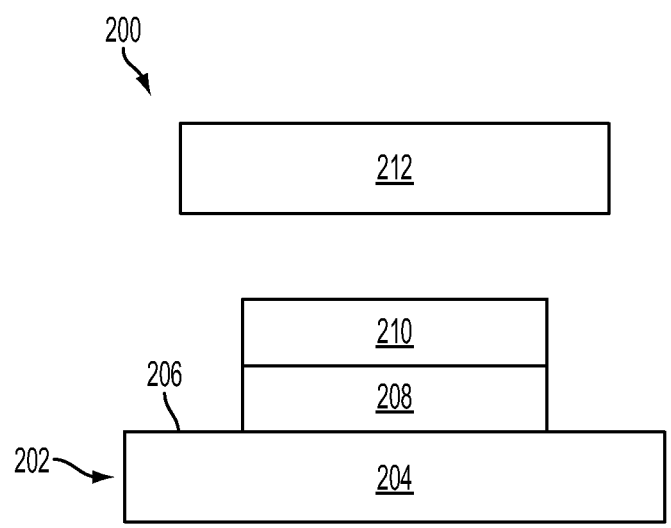
FIG. 2 is a cross sectional view of an exemplary integrated circuit package in fabrication including a solder bump to which the method in FIG. 1 can be applied.

FIG. 2 is a cross section of an exemplary integrated circuit package 200 in fabrication including a solder bump to which the method in FIG. 1 can be applied. In FIG. 2, a substrate 202 provides structural support for the integrated circuit package 200 in fabrication. The substrate 202 can have an active surface 206 formed over bulk material 204 containing analog or digital circuits implemented as active devices, passive devices, conductive layers, and dielectric layers electrically interconnected according to the electrical design and function of the integrated circuit package 200. The bulk material 204 of the substrate 202 can comprise a base substrate material, such as silicon, germanium, gallium arsenide, indium phosphide, silicon carbide, laminate BT (bismaleimide triazine) substrate, or any other suitable material for structural support.

An electrical pad or trace 208 for electrical connections is formed over the substrate 202 using physical vapor deposition (PVD), chemical vapor deposition (CVD), electrolytic plating, electroless plating process, or any other suitable deposition process for electrically conductive material such as metal. The electrical pad or trace 208 can be one or more layers of Al, Cu, Sn, Ni, Au, Ag, or other suitable electrically conductive material.

Alternatively, the substrate 202 can be a printed circuit board (PCB). In some embodiments, PCBs with organic solderability preservatives (OSPs) can be used. The electrical pad or trace 208 comprises electrically conductive material. The electrical pad or trace 208 is formed over the PCB as the substrate 202, using evaporation, electrolytic plating, electroless plating, screen printing, or any other suitable process. The electrical pad or trace 208 provides electrical connections between each of the semiconductor packages, mounted components, and other external system components, including power and ground connections.

An electrically conductive solder bump 210 is deposited over the electrical pad or trace 208 using an evaporation, electrolytic plating, electroless plating, ball drop, or screen printing process. The solder bump 210 can comprise Al, Sn, Ni, Au, Ag, Pb, Bi, Cu, solder, and combinations thereof, with an optional flux solution. For example, the solder bump 210 material can be eutectic Sn/Pb, high-lead solder, or lead-free solder, etc. In various embodiments, other layers such as under bump metal (UBM) can be formed between the solder bump 210 and the electrical signal pad or trace 208.

The solder bump 210 material is bonded to electrical pad or trace 208 using a suitable attachment or bonding process. In one embodiment, the solder bump 210 material is reflowed by heating the material above its melting point to form spherical balls or bumps. In some applications, solder bumps 210 are reflowed a second time to improve electrical contact to electrical pad or trace 208. The solder bumps 210 can also be compression bonded to the electrical pad or trace 208. Solder bumps 210 can be used in different interconnect structures using bond wires, stud bump, micro bump, ball grid array (BGA), or other electrical interconnect. A die 212 is mounted over the substrate 202 using the solder bump 210 for electrical connections later in the packaging process.

At step 104 in FIG. 1, vacuum annealing (baking) is performed on the substrate (e.g., 202) having at least one solder bump (e.g., 210) to reduce voids at the interface or inside of the at least one solder bump. The substrate is annealed at above melting temperature of the solder bump, e.g., 240° C., for about 30 sec or more, under $10^{-2}$ torr pressure in one example.

Figure 3A:
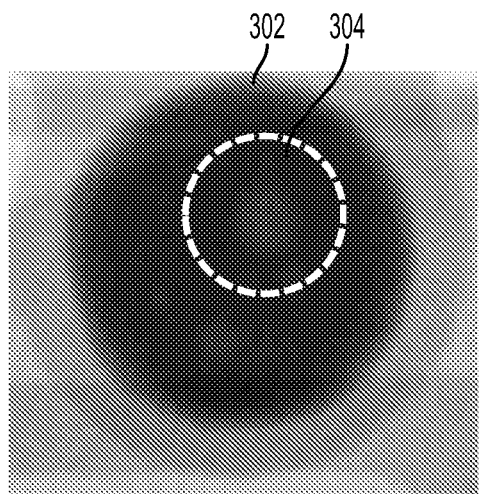
FIG. 3A is a top view of an exemplary solder bump before vacuum annealing in FIG. 1.
Figure 3B:
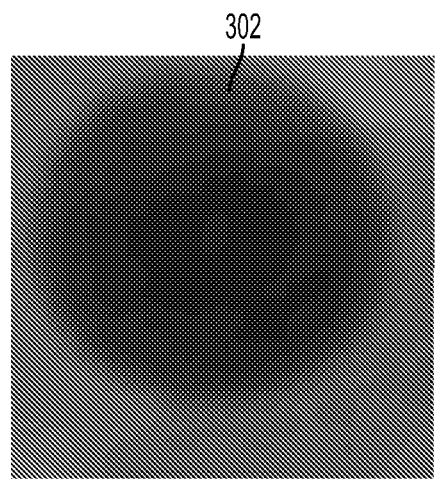
FIG. 3B is a top view of an exemplary solder bump after vacuum annealing in FIG. 1.

FIG. 3A is a top view of an exemplary solder bump before vacuum annealing in FIG. 1, and FIG. 3B is a top view of an exemplary solder bump after vacuum annealing in FIG. 1. In FIG. 3A, a solder bump 302 is shown with a void 304 at interface with the substrate before the vacuum annealing step 104. In FIG. 3B, the solder bump 302 is shown where the void 304 has disappeared or at least reduced after the vacuum annealing step 104.

The vacuum annealing condition may vary depending on solder bump materials: (1) for Sn—Ag having a melting temperature of 210° C.-220° C., the annealing temperature can be 240° C.-250° C. for about 30 sec or more at the vacuum pressure of $10^{-2}$ torr-$10^{-6}$ torr; (2) for Sn—Ag—Cu having a melting temperature of 210° C.-225° C., the annealing temperature can be 240° C.-250° C. for about 30 sec or more at the vacuum pressure of $10^{-2}$ torr-$10^{-6}$ torr; (3) for Sn—Cu having a melting temperature of 220° C.-230° C., the annealing temperature can be 240° C.-250° C. for about 30 sec or more at the vacuum pressure of $10^{-2}$ torr-$10^{-6}$ torr; (4) Sn—Zn having a melting temperature of 190° C.-200° C., the annealing temperature can be 220° C.-230° C. for about 30 sec or more at the vacuum pressure of $10^{-2}$ torr-$10^{-6}$ torr; (5) Sn—Bi having a melting temperature of 140° C.-150° C., the annealing temperature can be 170° C.-180° C. for about 30 sec or more at the vacuum pressure of $10^{-2}$ torr-$10^{-6}$ torr; and (6) for In—Sn having a melting temperature of 130° C.-140° C., the annealing temperature can be 160° C.-170° C. for about 30 sec or more at the vacuum pressure of $10^{-2}$ torr-$10^{-6}$ torr. Vacuum annealing at a higher temperature than listed above for respective solder material may induce substrate damage or intermetallic compound overgrowth during the process.

For other solder materials, similar annealing temperatures relative to the melting temperatures and vacuum pressures can be applied. For example, annealing temperatures of about 20-30° C. higher than the melting temperature can be applied for about 30 sec or more at the vacuum pressure of $10^{-2}$ torr-$10^{-6}$ torr. Vacuum annealing at too high temperatures may induce substrate damage or intermetallic compound overgrowth during the process.

At step 106 in FIG. 1, a die (e.g., 212) is mounted (die attach) over the substrate (e.g., 202) using the solder bump (e.g., 210). In some embodiments, the die 212 in FIG. 2 has through substrate via (TSV) for electrical connections. In various embodiments, other layers can be formed between the die 212 and the solder bump 210 in FIG. 2 to facilitate electrical connection. For example, a pad, a trace, a Cu pillar, and/or another solder layer can be formed (not shown) between the die 212 and the solder bump 210 depending on applications. Also, other layers such as under bump metal (UBM) can be formed between the solder bump 210 and the electrical signal pad or trace 208.

At step 108, a reflow process is used to melts the solder and heat the adjoining surfaces for soldering, to electrically connect the joint between the die (e.g., 212) and the substrate (e.g., 202). Heating may be accomplished by passing the assembly through a reflow oven or under an infrared lamp, by soldering with a hot air pencil, or any other suitable process.

At step 110, the flux material from soldering is cleaned. For example, hot water with solvents, e.g., KOH and/or ether solvent, can be used to clean the flux material from the package assembly 200 after the die 212 and the substrate 202 are attached using the solder bump 210.

Using the above method, pre-existing voids (e.g., 304) at the interface or inside of the solder bump (e.g., 302), can be removed or reduced as shown in FIG. 3B, e.g., in a flip chip package, ball grid array (BGA) package, etc. After removing the pre-existing void, the EM life of the solder bump 302 will be improved. In one example, the EM life has improved from 260 hrs to 1250 hrs, and the maximum current the solder bump can sustain (Imax) has improved from 36 mA to 180 mA by using the method in FIG. 1 due to the removal and/or shrinkage of voids at the interface of or in the solder bump 210.

Figure 4:
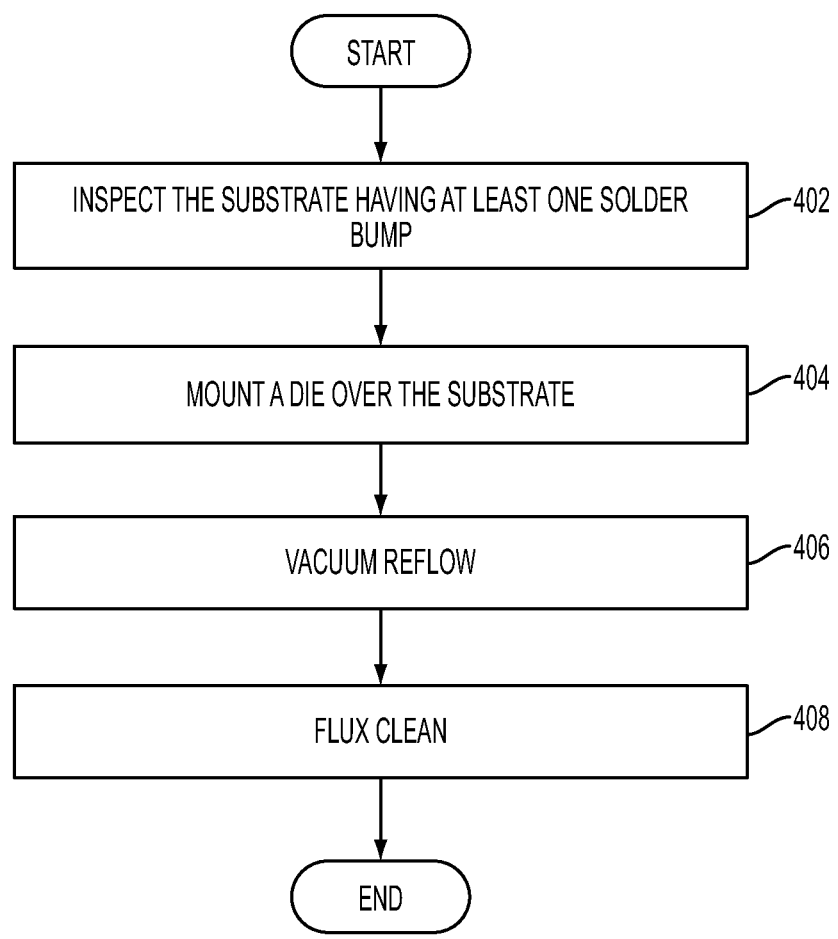
FIG. 4 is a flowchart of another exemplary method to improve the EM lifetime of solder bumps according to some embodiments.

FIG. 4 is a flowchart of another exemplary method to improve the EM lifetime of solder bumps according to some embodiments. At step 402, a substrate having at least one solder bump is inspected for defects and residues from previous processes, e.g., using a microscope. At step 404, a die (e.g., 212) is mounted (die attach) over the substrate (e.g., 202) using the solder bump (e.g., 210).

At step 406, a vacuum reflow process is used for soldering to electrically connect the joint between the die (e.g., 212) and the substrate (e.g., 202) and also remove or reduce voids (e.g., 304) at the interface of the solder bump (e.g., 210) with the substrate (e.g., 202) or inside the solder bump. The vacuum annealing process similar to the step 104 in FIG. 1 and reflowing process similar to the step 108 in FIG. 1 are performed at the same time. The vacuum and heating conditions depending on the solder material are the same as described above. At step 408, the flux material from soldering is cleaned, similar to the step 110 in FIG. 1.

According to some embodiments, a method includes vacuum annealing on a substrate having at least one solder bump to reduce voids at an interface of the at least one solder bump. A die is mounted over the substrate.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method, comprising:
performing a vacuum annealing on a substrate having at least one solder bump to reduce voids at an interface of the at least one solder bump, wherein the vacuum annealing is performed as part of a soldering process in which the at least one solder bump is reflowed, thereby electrically connecting an electrical pad of an adjoining surface of the substrate to an adjoining surface of a die, each of the electrical pad and the adjoining surface comprising copper; and
mounting the die over the substrate,
wherein the vacuum annealing and the reflowing are performed at the same time.

2. The method of claim 1, further comprising performing flux cleaning.

3. The method of claim 2, wherein the flux cleaning is performed using KOH or ether solvent.

4. The method of claim 1, wherein the vacuum annealing is performed at a temperature about 20° C. to 30° C. higher than a melting temperature of the at least one solder bump.

5. The method of claim 1, wherein the at least one solder bump comprises Sn—Ag, Sn—Ag—Cu, or Sn—Cu and the vacuum annealing is performed at a temperature ranging from about 240° C. to 250° C.

6. The method of claim 1, wherein the at least one solder bump comprises Sn—Zn and the vacuum annealing is performed at a temperature ranging from about 220° C. to 230° C.

7. The method of claim 1, wherein the at least one solder bump comprises Sn—Bi and the vacuum annealing is performed at a temperature ranging from about 170° C. to 180° C.

8. The method of claim 1, wherein the at least one solder bump comprises In—Sn and the vacuum annealing is performed at a temperature ranging from about 160° C. to 170° C.

9. The method of claim 1, wherein the vacuum annealing is performed for 30 seconds or more.

10. The method of claim 1, wherein the soldering process comprises electrically connecting the die to the substrate through an electrical pad or pillar on the die.

11. The method of claim 1, wherein the soldering process comprises passing the substrate and the die through a reflow oven.

12. A method, comprising:
performing a vacuum annealing on a substrate having at least one solder bump to reduce voids at an interface of the at least one solder bump, wherein the vacuum annealing is performed:
for about 30 seconds, and
as part of a reflow process comprising soldering the at least one solder bump to an adjoining surface of the substrate and to an adjoining surface of a die, thereby electrically connecting the substrate to the die, wherein each of the adjoining surfaces comprises copper;
mounting the die over the substrate; and
performing flux cleaning,
wherein the vacuum annealing and the reflow process are performed at the same time.

13. The method of claim 12, wherein the vacuum annealing is performed at a temperature about 20° C. to 30° C. higher than a melting temperature of the at least one solder bump.

14. The method of claim 12, wherein the soldering the at least one solder bump to the adjoining surface of the substrate comprises electrically connecting the die to the substrate through an electrical pad on a surface of the substrate.

15. The method of claim 12, wherein the reflow process comprises passing the die and the substrate through a reflow oven.

16. The method of claim 12, wherein the electrically connecting the substrate to the die comprises electrically connecting the substrate to a through substrate via (TSV) of the die.

17. A method, comprising:
mounting a die over a substrate having at least one solder bump;
performing a vacuum reflowing process to the at least one solder bump of the substrate, the vacuum reflowing process comprising:
applying a temperature about 20° C. to 30° C. higher than a melting temperature of the at least one solder bump;
applying a vacuum pressure of $10^{-2}$ torr-$10^{-6}$ torr to reduce voids at an interface of the at least one solder bump;
performing a simultaneous soldering operation that electrically connects the at least one solder bump to an adjoining surface of the substrate and to an adjoining surface of the die, wherein each of the adjoining surfaces comprises copper; and
performing the vacuum reflowing process for about 30 seconds; and
performing flux cleaning.

18. The method of claim 17, wherein the flux cleaning is performed using KOH or ether solvent.

19. The method of claim 17, wherein the performing the simultaneous soldering operation comprises electrically connecting the at least one solder bump to a trace on the substrate.

20. The method of claim 17, wherein the performing the simultaneous soldering operation comprises electrically connecting the at least one solder bump to a through substrate via (TSV) of the die.

* * * * *